United States Patent
Setlur et al.

(10) Patent No.: US 7,229,573 B2
(45) Date of Patent: Jun. 12, 2007

(54) CE$^{3+}$ AND EU$^{2+}$ DOPED PHOSPHORS FOR LIGHT GENERATION

(75) Inventors: Anant Achyut Setlur, Niskayuna, NY (US); Emil Radkov, Euclid, OH (US)

(73) Assignee: Gelcore, LLC, Valley View, OH (US)

( * ) Notice: Subject to any disclaimer, the term of this patent is extended or adjusted under 35 U.S.C. 154(b) by 345 days.

(21) Appl. No.: 10/827,738

(22) Filed: Apr. 20, 2004

(65) Prior Publication Data

US 2005/0230689 A1    Oct. 20, 2005

(51) Int. Cl.
*C09K 11/64*    (2006.01)
*C09K 11/59*    (2006.01)
*G02F 2/07*    (2006.01)
*H01J 63/04*    (2006.01)
*H05B 33/00*    (2006.01)

(52) U.S. Cl. ................... 252/301.4 R; 257/98; 313/503
(58) Field of Classification Search ................. 313/503; 257/98; 252/301.4 S, 301.4 R, 301.4 F
See application file for complete search history.

(56) References Cited

U.S. PATENT DOCUMENTS

| | | | | |
|---|---|---|---|---|
| 3,574,130 A | * | 4/1971 | Mathers et al. | 252/301.4 R |
| 4,374,037 A | * | 2/1983 | Takahashi | 252/301.4 S |
| 4,510,414 A | * | 4/1985 | Fujino et al. | 313/468 |
| 5,424,006 A | * | 6/1995 | Murayama et al. | 252/301.4 R |
| 6,252,254 B1 | | 6/2001 | Soules et al. | |
| 6,580,096 B2 | | 6/2003 | Chen et al. | |
| 6,649,946 B2 | | 11/2003 | Bogner et al. | |
| 6,657,379 B2 | | 12/2003 | Ellens et al. | |
| 6,670,748 B2 | | 12/2003 | Ellens et al. | |
| 6,680,569 B2 | | 1/2004 | Mueller-Mach et al. | |
| 6,850,002 B2 | * | 2/2005 | Danielson et al. | 313/501 |
| 6,982,045 B2 | * | 1/2006 | Menkara et al. | 252/301.4 F |

FOREIGN PATENT DOCUMENTS

| | | | |
|---|---|---|---|
| EP | 1 394 864 A1 | | 3/2004 |
| JP | 10-163535 | * | 6/1998 |
| WO | WO 02/11173 | * | 2/2002 |
| WO | WO 2004/055910 | * | 7/2004 |

OTHER PUBLICATIONS

Lehmann et al, "Cathodoluminescence of CaS:Ce3+ and CaS:Eu2+ Phosphors", Luminescence of Solid Solution, vol. 118, No. 3, pp. 477-482, Mar. 1971.*
W. Lehmann and F. M. Ryan, "Cathodulminescence of CaS:Ce$^{3+}$ and CaS:Eu$^{2+}$ Phosphors", J. Electrochem.Soc., Mar. 1971, v. 118, pp. 477-482.

* cited by examiner

*Primary Examiner*—C. Melissa Kolsow
(74) *Attorney, Agent, or Firm*—Fay Sharpe LLP

(57) ABSTRACT

Disclosed are phosphor compositions doped with both Ce$^{3+}$ and Eu$^{2+}$ and light emitting devices including a semiconductor light source and the above phosphor. Also disclosed are phosphor blends of the above phosphors and one ore more additional phosphors and white light emitting devices incorporating the same. The preferred blends are used to make light sources with CRI values greater than 90 at any CCT from about 2500 to 8000 K.

22 Claims, 3 Drawing Sheets

— CE³⁺ AND EU²⁺ DOPED PHOSPHORS FOR LIGHT GENERATION

BACKGROUND

The present exemplary embodiments relate to phosphor compositions for the conversion of radiation emitted by a light source. It finds particular application in conjunction with converting LED-generated ultraviolet (UV) or blue radiation into white light for general illumination purposes. It should be appreciated, however, that the invention is also applicable to the conversion of radiation from UV and/or blue lasers as well as other UV sources to white light.

Light emitting diodes (LEDs) are semiconductor light emitters often used as a replacement for other light sources, such as incandescent lamps. They are particularly useful as display lights, warning lights and indicating lights or in other applications where colored light is desired. The color of light produce by an LED is dependent on the type of semiconducting material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

LEDs rely on its semiconductor to emit light. The light is emitted as a result of electronic excitation of the semiconductor material. As radiation (energy) strikes atoms of the semiconductor material, an electron of an atom is excited and jumps to an excited (higher) energy state. The higher and lower energy states in semiconductor light emitters are characterized as the conduction band and the valence band, respectively. The electron, as it returns to its ground energy state, emits a photon. The photon corresponds to an energy difference between the exited state and ground energy state, and results in an emission of radiation.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complimentary color, e.g. a yellow-green emission. Together, the blue and yellow-green radiation produces a white light. There are also white LEDs that utilize a UV emitting chip and a phosphor blend including red, green and blue emitting phosphors designed to convert the UV radiation to visible light.

One known yellow-whitish light emitting device comprises a blue light-emitting LED having a peak emission wavelength in the near UV-to-blue range (from about 315 nm to about 480 nm) combined with a yellow light-emitting phosphor, such as cerium doped yttrium aluminum garnet $Y_3Al_{4.9}O_{12-\delta}$:$Ce^{3+}$ ("YAG") wherein $\delta$ is typically between about −1 to 1. The phosphor absorbs a portion of the radiation emitted from the LED and converts the absorbed radiation to a yellow light. The remainder of the blue light emitted by the LED is transmitted through the phosphor and is mixed with the yellow light emitted by the phosphor. A viewer perceives the mixture of blue and yellow light, which in most instances is perceived as a whitish-yellow light.

The blue LED-YAG phosphor device described above typically produces a white light with a color rendering index (CRI) of from about 74–82 with a tunable color temperature range of from about 4500 to 8000 K. While suitable for some applications, most users desire a light source with a higher CRI, one with a CRI similar to incandescent lamps approaching 95–100.

The limitation in CRI and CCT values for blue LED-YAG light sources is due in part to the lack of red in the device emission spectra. Red phosphors, such as CaS:$Eu^{2+}$ have been added to such devices in increase the range of CCTs and CRIs available. However, these new red materials have the disadvantage of absorbing radiation emitted by the YAG phosphor, resulting in an inevitable loss mechanism due to the reduced quantum efficiency. State of the art red enhanced devices have a typical conversion efficiency of only about 70% that of blue LED-YAG devices.

It would be therefore be desirable to develop a nearly full-spectrum LED based light source capable of producing CCTs ranging from 2500 to 10000 K and CRIs from 50–99 without a significant drop in quantum efficiency compared to YAG based devices. The present invention provides a new and improved phosphor blend and method of formation, which overcomes the above-referenced problems and others.

SUMMARY OF THE INVENTION

In a first aspect, there is provided a light emitting device including a semiconductor light source having a peak emission from about 350 to about 550 nm and a phosphor including a host lattice doped with $Ce^{3+}$ and $Eu^{2+}$.

In a second aspect, there is provided a phosphor including a host lattice containing $Ce^{3+}$ and $Eu^{2+}$ ions, wherein the $Ce^{3+}$ is capable of absorbing a first radiation having a peak emission from about 350 to about 550 nm and further wherein energy from the absorbed radiation is capable of being transferred from $Ce^{3+}$ ions to the $Eu^{2+}$ ions, resulting in emission of a second radiation from the $Eu^{2+}$ ions.

In a third aspect, there is provided a phosphor blend including a first phosphor having a host lattice containing $Ce^{3+}$ and $Eu^{2+}$ ions, wherein the phosphor blend is capable of emitting light suitable for use in general illumination either alone or in combination with radiation emitted by a semiconductor light source radiationally coupled to the phosphor.

DETAILED DESCRIPTION OF THE PREFERRED EMBODIMENTS

Phosphors convert radiation (energy) to visible light. Different combinations of phosphors provide different colored light emissions. The colored light that originates from the phosphors provides a color temperature. Novel phosphor compositions are presented herein as well as their use in LED and other light sources.

A phosphor conversion material (phosphor material) converts generated UV or visible radiation to a different wavelength visible light. The color of the generated visible light is dependent on the particular components of the phosphor material. The phosphor material may include only a single phosphor composition or two or more phosphors of basic color, for example a particular mix with one or more of a yellow and red phosphor to emit a desired color (tint) of light. As used herein, the term "phosphor material" is intended to include both a single phosphor composition as well as a blend of two or more phosphors unless otherwise noted.

In one aspect, it was determined that an LED lamp that produces a bright-white light would be useful to impart desirable qualities to LEDs as light sources. Therefore, in one embodiment of the invention, a luminescent material phosphor conversion material blend (phosphor blend) coated LED chip is disclosed for providing white light. The individual phosphors and a phosphor blend including the individual phosphors convert radiation at a specified wavelength, for example radiation from about 350 to 550 nm as emitted by a near UV or visible LED, into a different wavelength visible light. The visible light provided by the phosphor blend (and LED chip if emitting visible light) comprises a bright white light with high intensity and brightness.

Figure 1:
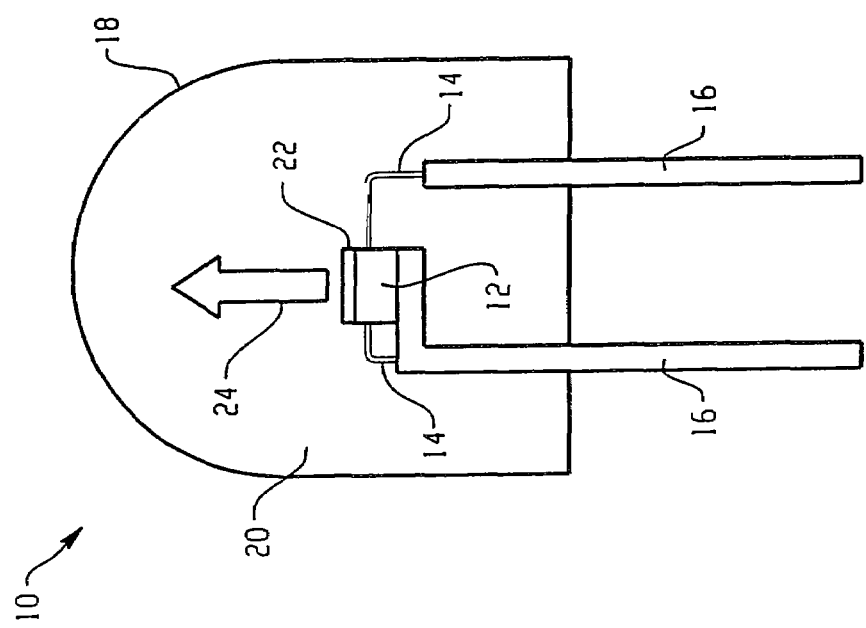
FIG. 1 is a schematic cross-sectional view of an illumination system in accordance with one embodiment of the present invention.

With reference to FIG. 1, an exemplary light emitting assembly or lamp 10 is shown in accordance with one preferred structure of the present invention. The light emitting assembly 10 comprises a semiconductor UV or visible radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor visible or UV light source that is capable of being absorbed when its emitted radiation is directed onto the phosphor. The preferred emission of the LED chip in the present invention will depend on the identity of the phosphors in the disclosed embodiments and may range from, e.g., 250–550 nm. In one preferred embodiment, however, the emission of the LED will be in the near UV to green region and have a wavelength in the range from about 350 to about 550 nm. Typically then, the semiconductor light source comprises an LED doped with various impurities. Thus, the LED may comprise a semiconductor diode based on any suitable III-V, II-VI or IV-IV semiconductor layers and having an emission wavelength of about 250 to 550 nm.

Preferably, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $i+j+k=1$) having an emission wavelength greater than about 250 nm and less than about 550 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

Organic light emissive structures are known in the art. A common high-efficiency organic emissive structure is referred to as the double heterostructure LED. This structure is very similar to conventional, inorganic LED's using materials as GaAs or InP. In this type of device, a support layer of glass is coated by a thin layer of indium/tin oxide (ITO) to form the substrate for the structure. Next, a thin (100–500 Å) organic, predominantly hole-transporting, layer (HTL) is deposited on the ITO layer. Deposited on the surface of the HTL layer is a thin (typically, 50–100 Å) emissive layer (EL). If these layers are too thin, there may be breaks in the continuity of the film; as the thickness of the film increases, the internal resistance increases, requiring higher power consumption for operation. The emissive layer (EL) provides the recombination site for electrons, injected from a 100–500 Å thick electron transporting layer (ETL) that is deposited upon the EL, and holes from the HTL layer. The ETL material is characterized by considerably higher mobility for electrons than for charge deficient centers (holes).

Another known organic emissive structure is referred to as a single heterostructure. The difference in this structure relative to that of the double heterostructure is that the electroluminescent layer also serves as an ETL layer, eliminating the need for the ETL layer. However, this type of device, for efficient operation, generally should incorporate an EL layer having good electron transport capability, otherwise a separate ETL layer must be included, rendering the structure effectively the same as a double heterostructure.

A known alternative device structure for an LED is referred to as a single layer (or polymer) LED. This type of device includes a glass support layer coated by a thin ITO layer, forming the base substrate. A thin organic layer of spin-coated polymer, for example, is then formed over the ITO layer, and provides all of the functions of the HTL, ETL, and EL layers of the previously described devices. A metal electrode layer is then formed over the organic polymer layer. The metal is typically Mg, Ca, or other conventionally used metals.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a phosphor composition 22 (described below). In an alternate embodiment, the lamp 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor composition 22 radiationally coupled to the LED chip 12. Radiationally coupled means that the elements are associated with each other so radiation from one is transmitted to the other. In a preferred embodiment, the phosphor composition 22 is a blend of two or more phosphors, as will be detailed below.

This phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor composition 22 and LED 12. Thus, the phosphor composition 22 may be coated over or directly on the light emitting surface of the LED chip 12 by coating and drying the phosphor suspension over the LED chip 12. Both the shell 18 and the encapsulant 20 should be transparent to allow light 24 to be transmitted through those elements. Although not intended to be limiting, in one embodiment, the median particle size of the phosphor composition may be from about 1 to about 10 microns.

Figure 2:
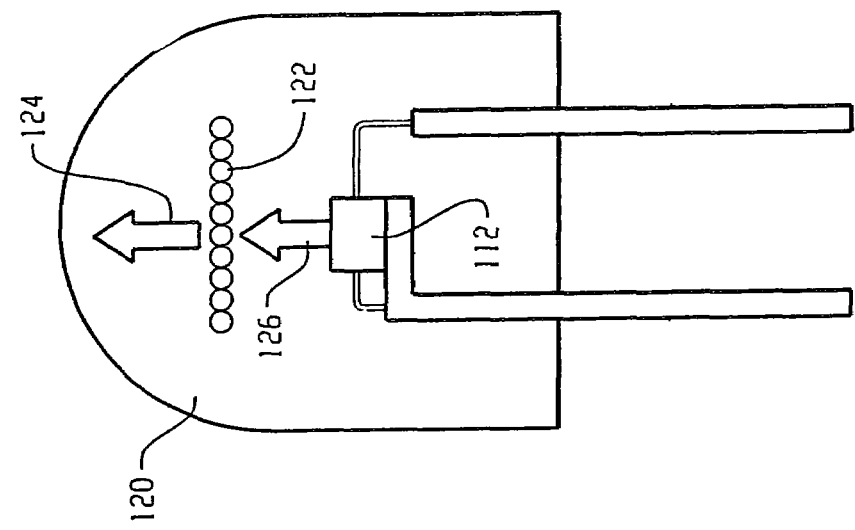
FIG. 2 is a schematic cross-sectional view of an illumination system in accordance with a second embodiment of the present invention.

FIG. 2 illustrates a second preferred structure of the system according to the preferred aspect of the present invention. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material 120 or, more preferably, throughout the entire volume of the encapsulant material. Radiation 126 emitted by the LED chip 112 mixes with the light emitted by the phosphor composition 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer loading.

Figure 3:
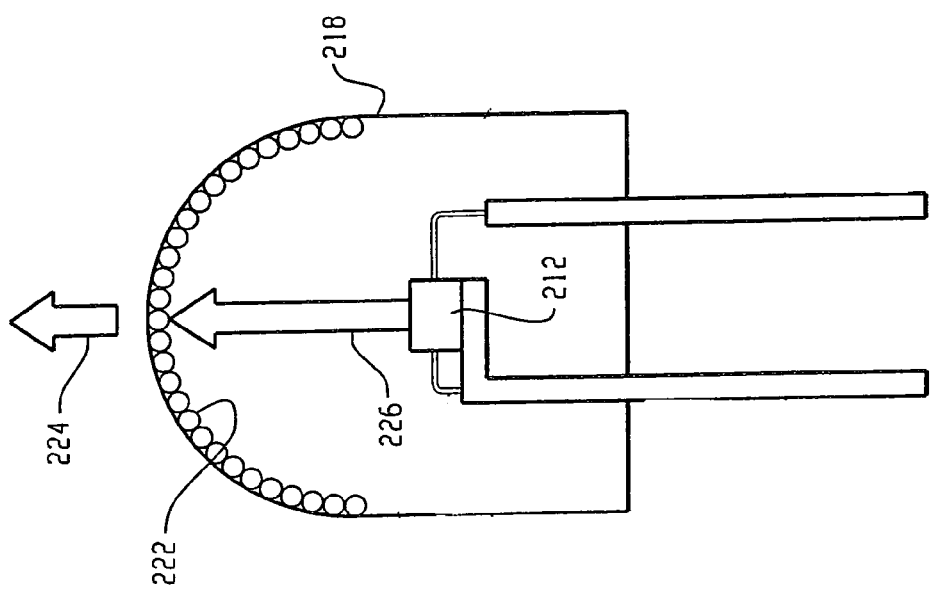
FIG. 3 is a schematic cross-sectional view of an illumination system in accordance with a third embodiment of the present invention.

FIG. 3 illustrates a third preferred structure of the system according to the preferred aspects of the present invention. The structure of the embodiment shown in FIG. 3 is similar to that of FIG. 1, except that the phosphor composition 222, is coated onto a surface of the shell 218, instead of being formed over the LED chip 212. The phosphor composition is preferably coated on the inside surface of the shell 218, although the phosphor may be coated on the outside surface of the shell, if desired. The phosphor composition 222 may be coated on the entire surface of the shell or only a top portion of the surface of the shell. The radiation 226 emitted by the LED chip 212 mixes with the light emitted by the phosphor composition 222, and the mixed light appears as white light 224. Of course, the structures of FIGS. 1–3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption.

Figure 4:
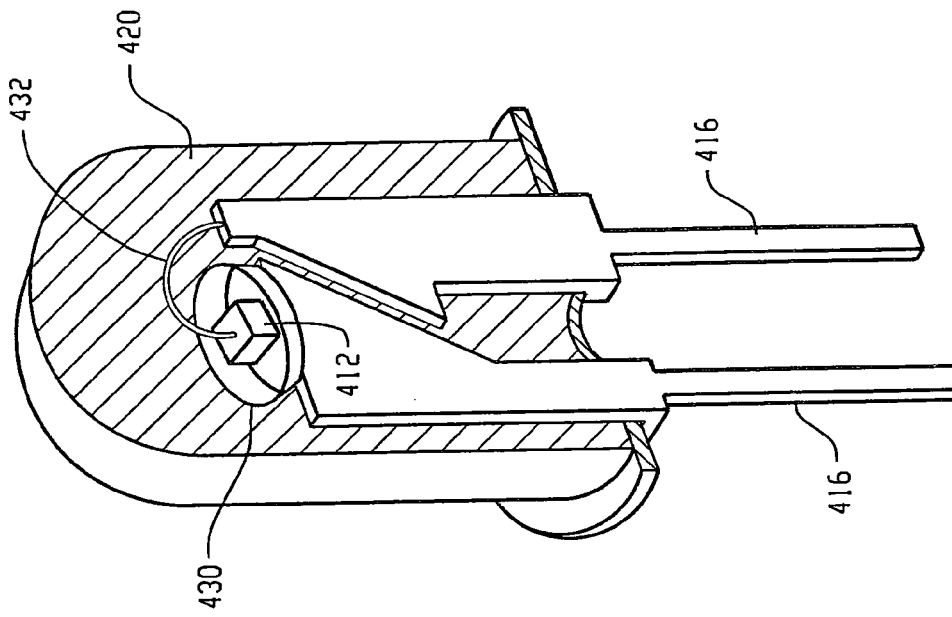
FIG. 4 is a cutaway side perspective view of an illumination system in accordance with a fourth embodiment of the present invention.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, the invention provides a novel phosphor composition, which may be used in the phosphor composition 22 in the above described LED light, wherein the phosphor lattice is doped with both $Ce^{3+}$ and $Eu^{2+}$ ions. Since energy transfer occurs between these two ions, one can control the composition of new phosphors for color, absorption and efficiency in LED packages.

The concept is based on $Ce^{3+}$ acting as a "sensitizer", absorbing the radiation emitted by the LED, which may range, e.g., from about 370–520 in one embodiment. This absorption is based upon proper host lattice selection such that there is a strong crystal field on the $Ce^{3+}$ 5d orbitals and/or a high covalency of the Ce-ligand bond. After absorption, energy is transferred from the $Ce^{3+}$ ions to $Eu^{2+}$ ions, which then release the energy by emitting in the visible region. Since the absorption/emission transitions for $Ce^{3+}$ and $Eu^{2+}$ are parity allowed transitions, energy transfer should readily and efficiently occur, even at low concentration of either ion.

With proper composition/synthesis control, one can control the overall phosphor color by adjusting the $Ce^{3+}/Eu^{2+}$ emission intensity ratio. In addition, the overall concentration of $Eu^{2+}$ in the host lattice can be reduced compared to conventional Eu2+ only doped phosphors (such as CaS: $Eu^{2+}$) since $Ce^{3+}$ will also absorb LED radiation. Because $Eu^{2+}$ doped phosphors are known to absorb the radiation emitted by other phosphors present in the device, this has the additional benefit of increasing the device package efficiency when additional phosphors are present (such as YAG:Ce), since less of the light emitted by these phosphors will be absorbed due to the lower concentration of $Eu^{2+}$. In one embodiment, the $Ce^{3+}$ doping levels may range from about 0.01 to about 20 mol % replacement and the $Eu^{2+}$ doping levels may range from about 0.01 to about 30 mol %. Charge compensation can occur via, e.g., K, Na, Li, Rb, or Cs ions.

Suitable host lattices (inclusive of all conventionally known charge compensation dopants) that may be doped with the combination of $Ce^{3+}$ and $Eu^{2+}$ include, but are not limited to, sulfides, oxosulfides, thiometallates, oxothiometallates, nitrides, oxonitrides, nitridosilicates, sialons, oxides, oxometallates, garnets, and silicates.

Specific non-limiting examples of suitable host lattices include:

$(Ca,Sr)_{p/2}Si_{12-p-q}Al_{p+q}O_qN_{16-q}$; where q=0 to 2.5 and p=1.5 to 3

$MSi_3N_5$, $M_2Si_4N_7$, $M_4Si_6N_{11}$, $M_9Si_{11}N_{23}$, $M_{16}Si_{15}O_6N_{32}$, $MSiAl_2O_3N_2$, $M_{13}Si_{18}Al_{12}$ $_{O18}N_{36}$, $MSi_5Al_2ON_9$, and $M_3Si_5AlON_{10}$; where M can be a divalent cation such as $Ca^{2+}$, $Sr^{2+}$, $Ba^{2+}$ or a trivalent cation such as Y, Lu, Gd, Sc, Tb, or La.

$M_xSi_yN_z$ where M is Ca, Ba, or Sr, where 0<x,y and z=2/3*x+4/3*y $(Ca,Sr)S$, $(Sr,Ca)(Al,Ga,In)_2S_4$ $SrY_2S_4$ $[(Mg,Ca,Sr,Ba)(O,S)]_x[(Al,Ga,In)_2(O,S)_3]_y(Mg,Ca,Sr,Ba,F,Cl,Br,I)_z$, where 0<x<1, 0≦y≦10, 0≦z<1.

$(Mg, Ca, Sr, Ba)_pSi_qAl_rO_xN_y$, where 1≦p≦16; 0≦q<30; 0≦r≦15, 0≦x<20 and 0<y<40.

These Ce3+ and Eu2+ doped phosphors can be used either individually for single color lamps or in blends with other phosphors to generate white light for general illumination. These phosphors can be blended with suitable phosphors to produce a white light emitting device with CCTs ranging from 2500 to 10,000 K and CRIs ranging from 50–99. Non-limiting examples of suitable phosphors for use with the present inventive phosphors in phosphor blends are listed below. The specific amounts of the individual phosphors used in the phosphor blend will depend upon the desired color temperature. The relative amounts of each phosphor in the phosphor blend can be described in terms of spectral weight. The spectral weight is the relative-amount that each phosphor contributes to the overall emission spectra of the phosphor blend. The spectral weight amounts of all the individual phosphors should add up to 1.

Non-limiting examples of suitable phosphors that may be used in combination with the $Ce^{3+}$ and $Eu^{2+}$ phosphors of the present invention include:

BLUE:
$(Ba,Sr,Ca)_5(PO_4)_3(Cl,F,Br, OH):Eu^{2+}, Mn^{2+}, Sb^{3+}$
$(Ba,Sr,Ca)MgAl_{10}O_{17}:Eu^{2+},Mn^{2+}$
$(Ba,Sr,Ca)BPO_5:Eu^{2+}, Mn^{2+}$
$(Sr,Ca)_{10}(PO_4)_6*nB_2O_3:Eu^{2+}$, where 0<n
$2SrO*0.84P_2O_5*0.16B_2O_3:Eu^{2+}$
$Sr_2Si_3O_8*2SrCl_2:Eu^{2+}$
$Ba_3MgSi_2O_8:Eu^{2+}$
$Sr_4Al_{14}O_{25}:Eu^{2+}$ (SAE)
$BaAl_8O_{13}:Eu^{2+}$ BLUE-GREEN:
$Sr_4Al_{14}O_{25}:Eu^{2+}$
$BaAl_8O_{13}:Eu^{2+}$
$2SrO-*0.84P_2O_5-*0.16B_2O_3:Eu^{2+}$
$(Ba,Sr,Ca)MgAl_{10}O_{17}:Eu^{2+},Mn^{2+}$
$(Ba,Sr,Ca)_5(PO_4)_3(Cl,F,OH):Eu^{2+},Mn^{2+}, Sb^{3+}$ GREEN:
$(Ba,Sr,Ca)MgAl_{10}O_{17}:Eu^{2+}, Mn^{2+}$ (BAMn)
$(Ba,Sr,Ca)Al_2O_4:Eu^{2+}$
$(Y,Gd,Lu,Sc,La)BO_3:Ce^{3+},Tb^{3+}$
$Ca_8Mg(SiO_4)_4Cl_2:Eu^{2+}, Mn^{2+}$
$(Ba,Sr,Ca)_2SiO_4:Eu^{2+}$
$(Ba,Sr,Ca)_2(Mg,Zn)Si_2O_7:Eu^{2+}$
$(Sr,Ca,Ba)(Al,Ga,In)_2S_4:Eu^{2+}$
$(Y,Gd,Tb,La,Sm,Pr, Lu)_3(Al,Ga)_5O_{12}:Ce^{3+}$
$(Ca,Sr)_8(Mg,Zn)(SiO_4)_4Cl_2: Eu^{2+}, Mn^{2+}$ (CASI)
$Na_2Gd_2B_2O_7:Ce^{3+}, Tb^{3+}$
$(Ba,Sr)_2(Ca,Mg,Zn)B_2O_6:K,Ce,Tb$ YELLOW-ORANGE:
$(Sr,Ca,Ba,Mg,Zn)_2P_2O_7:Eu^{2+}, Mn^{2+}$ (SPP);
$(Ca,Sr,Ba,Mg)_{10}(PO_4)_6(F,Cl,Br,OH): Eu^{2+},Mn^{2+}$ (HALO);

RED:
$(Gd,Y,Lu,La)_2O_3:Eu^{3+}, Bi^{3+}$
$(Gd,Y,Lu,La)_2O_2S:Eu^{3+},Bi^{3+}$
$(Gd,Y,Lu,La)VO_4:Eu^{3+},Bi^{3+}$
$(Ca,Sr)S:Eu^{2+}$
$SrY_2S_4: Eu^{2+}$
$CaLa_2S_4:Ce^{3+}$
$3.5MgO*0.5MgF_2*GeO_2:Mn^{4+}$ (MFG)
$(Ba,Sr,Ca)MgP_2O_7:Eu^{2+},Mn^{2+}$
$(Y,Lu)_2WO_6:Eu^{3+}, Mo^{6+}$
$(Ba,Sr,Ca)_xSi_yN_z:Eu^{2+}$

As stated, the inventive phosphors can be used either alone to make single color light sources or in blends for white light sources. In one preferred embodiment, the phosphor composition is a blend of a red emitting phosphor, a green emitting phosphor, and a blue emitting phosphor, such that the light emitted from the backlight is a white light.

When the phosphor composition includes a blend of two or more phosphors, the ratio of each of the individual phosphors in the phosphor blend may vary depending on the characteristics of the desired light output. The relative proportions of the individual phosphors in the various embodiment phosphor blends may be adjusted such that when their emissions are blended and employed in an backlighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. As stated, however, the exact identity and amounts of each phosphor in the phosphor composition can be varied according to the needs of the end user.

The above described $Ce^{3+}$ and $Eu^{2+}$ doped phosphor compositions may be produced using known solid state reaction processes for the production of phosphors. Depending on the identity of the host lattice, a wide range of starting materials may be used. Thus, exemplary starting materials may include, for example, elemental oxides, carbonates and/or hydroxides as starting materials. Other starting materials may include nitrates, sulfates, acetates, citrates, or oxalates. In a typical process, the starting materials are combined via a dry or wet blending process and fired in air or under a reducing atmosphere at from, e.g., 900 to 1600° C.

A fluxing agent may be added to the mixture before or during the step of mixing. This fluxing agent may be $NH_4Cl$ or any other conventional fluxing agent, such as a fluoride of at least one metal selected from the group consisting of terbium, aluminum, gallium, and indium. A quantity of a fluxing agent of less than about 20, preferably less than about 10, percent by weight of the total weight of the mixture is adequate for fluxing purposes.

The starting materials may be mixed together by any mechanical method including, but not limited to, stirring or blending in a high-speed blender or a ribbon blender. The starting materials may be combined and pulverized together in a bowl mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a temperature from about 900° C. to about 1700° C., preferably from about 900° C. to about 1500° C., for a time sufficient to convert all of the mixture to the final composition.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen, helium, neon, argon, krypton, xenon, or a combination thereof. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

The precipitate may be filtered, washed with deionized water, and dried. The dried precipitate may be ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1000–1600° C. for a sufficient time under a reducing atmosphere such as $H_2$, CO, or a mixture of one of theses gases with an inert gas, or an atmosphere generated by a reaction between a coconut charcoal and the products of the decomposition of the starting materials to covert all of the calcined material to the desired phosphor composition.

It may be desirable to add pigments or filters to the phosphor composition. When the LED is a UV emitting LED, the phosphor layer 22 may also comprise from 0 up to about 5% by weight (based on the total weight of the phosphors) of a pigment or other UV absorbent material capable of absorbing or reflecting UV radiation having a wavelength between 250 nm and 450 nm.

Suitable pigments or filters include any of those known in the art that are capable of absorbing radiation generated between 250 nm and 450 nm. Such pigments include, for example, nickel titanate or praesodimium zirconate.

By assigning appropriate spectral weights for each phosphor, we can create spectral blends to cover the relevant portions of color space, especially for white lamps. For various desired CCT's, CRI's and color points, one can determine the appropriate amounts of each phosphor to include in the blend. Thus, one can customize phosphor blends to produce almost any CCT or color point, with corresponding high CRI. Of course, the color of each phosphor will be dependent upon its exact composition (e.g. relative amounts of Ba, Ca, Sr, as well as Eu in BAM phosphor). However, determining the changes in the spectral weight to produce the same or similar characteristic lighting device necessitated by such variations is trivial and can be accomplished by one skilled in the art using various methodologies, such as design of experiment (DOE) or other strategies.

By use of the present invention, particularly the blends described in embodiment two, lamps can be provided having CRI values greater than 90, over the entire range of color temperatures of interest for general illumination (2500 K to 8000 K). In some blends, the CRI values may approach the theoretical maximum of 100.

EXAMPLE

Figure 5A:
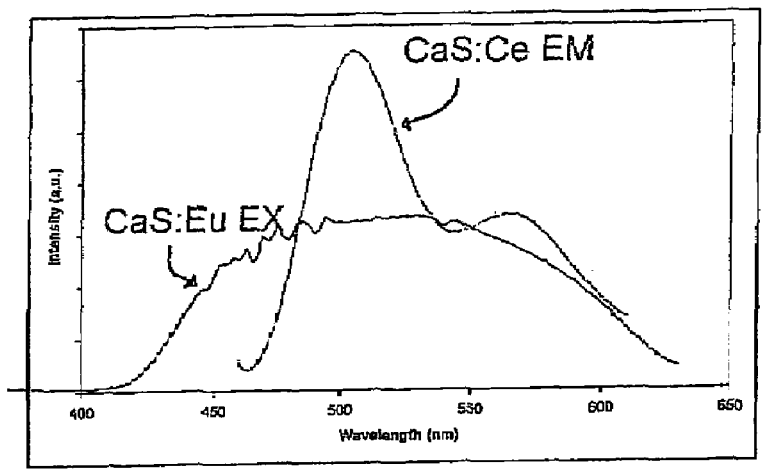
FIGS. 5a–5b are various absorption and emission spectrums of known phosphors and the absorption spectrum of a phosphor according to one embodiment of the invention.
Figure 5B:
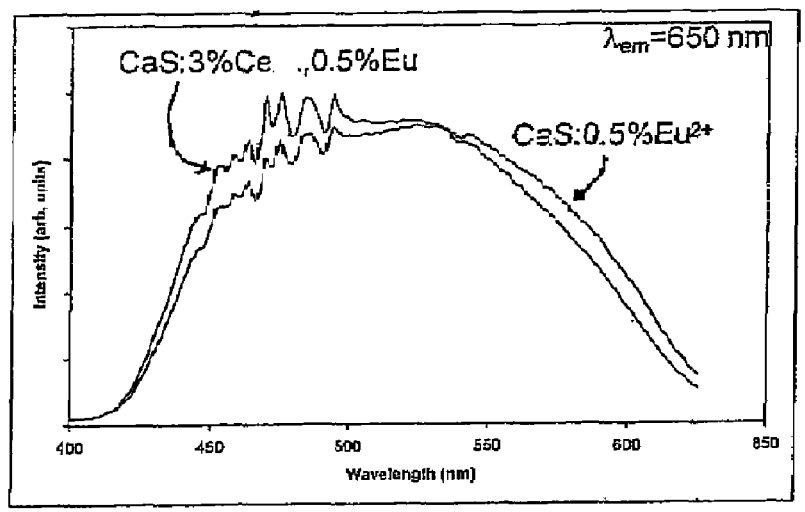

FIG. 5a is a graphical depiction of the excitation (i.e. absorption) and emission spectrum of CaS:Eu and CaS:Ce, respectively. It can be seen that CaS:Ce has a strong emission peak at about 510 nm. Typical LED devices with CaS:Eu, however, show re-absorption losses due to the broad absorption of CaS:Eu spanning green regions of the visible spectrum, resulting in reduced efficiency. FIG. 5b is a graphical depiction of the excitation spectra of CaS doped with 0.5 mol % $Eu^{2+}$ compared to a CaS phosphor doped with 3% $Ce^{3+}$ and 0.5% $Eu^{2+}$. This modified Ce and Eu doped phosphor shows an enhanced absorption in the near UV and blue regions due to the presence of the $Ce^{3+}$, resulting in a more efficient absorption of LED light.

The invention has been described with reference to the preferred embodiment. Obviously, modifications and alterations will occur to others upon reading and understanding the preceding, detailed description. It is intended that the invention be construed as including all such modifications and alterations, insofar as they come within the scope of the appended claims or the equivalents thereof.

What is claimed is:

1. A lighting apparatus for emitting light comprising:
   a semiconductor light source emitting radiation at from about 350 nm to about 550 nm; and
   a phosphor composition radiationally coupled to the light source, the phosphor composition comprising a host lattice doped with $Ce^{3+}$ and $Eu^{2+}$, wherein said host lattice is selected from the group consisting of nitrides, oxonitrides, nitridosilicates, and sialons.

2. The lighting apparatus of claim 1, wherein the light source is an LED.

3. The lighting apparatus of claim 2, wherein the LED comprises a nitride compound semiconductor represented by the formula $In_iGa_jAl_kN$, where $0 \leq i$; $0 \leq j$, $0 \leq K$, and $i+j+k=1$.

4. The lighting apparatus of claim 1, wherein the light source is an organic emissive structure.

5. The lighting apparatus of claim 1, wherein the phosphor composition is coated on the surface of the light source.

6. The lighting apparatus of claim 1, further comprising an encapsulant surrounding the light source and the phosphor composition.

7. The lighting apparatus of claim 6, wherein the phosphor composition is dispersed in the encapsulant.

8. The lighting apparatus of claim 1, further comprising a reflector cup.

9. The lighting apparatus of claim 1, wherein the lighting apparatus emits white light.

10. The lighting apparatus of claim 1, wherein said host lattice is selected from the group consisting of:
   A) $(Ca,Sr)_{p/2}Si_{12-p-q}Al_{p+q}O_qN_{16-q}$, where q=0 to 2.5 and p=1.5 to 3;

B) $MSi_3N_5$, $M_2Si_4N_7$, $M_4Si_6N_{11}$, $M_9Si_{11}N_{23}$, $M_{16}Si_{15}O_6N_{32}$, $MSiAl_2O_3N_2$, $M_{13}Si_{18}Al_{12}O_{18}N_{36}$, $MSi_5Al_2ON_9$, and $M_3Si_5AlON_{10}$; where M comprises a divalent cation selected from $Ca^{2+}$, $Sr^{2+}$, $Ba^{2+}$ or combinations thereof, or a trivalent cation selected from Y, Lu, Gd, Sc, Tb, Y, or combinations thereof;

C) $M_xSi_yN_z$ where M is Ca, Ba, and/or Sr, 0<x, y and z=2/3*x+4/3*y; and

D) $(Mg, Ca, Sr, Ba)_pSi_qAl_rO_xN_y$, where $1 \leq p \leq 16$; $0 \leq q < 30$; $0 \leq r \leq 15$, $0 \leq x < 20$ and $0 < y < 40$.

11. The lighting apparatus of claim 1, wherein the $Ce^{3+}$ doping level ranges from about 0.01 to about 20 mol % replacement and the $Eu^{2+}$ doping level ranges from about 0.01 to about 30 mol %.

12. The lighting apparatus of claim 1, further comprising one or more additional phosphors selected from the group consisting of $(Ba,Sr,Ca)_5(PO_4)_3(Cl,F,Br,OH):Eu^{2+},Mn^{2+}$, $Sb^{3+}$; $(Ba,Sr,Ca)MgAl_{10}O_{17}:Eu^{2+}$, $Mn^{2+}$; $(Ba,Sr,Ca)BPO_5:Eu^{2+}$, $Mn^{2+}$; $(Sr,Ca)_{10}(PO_4)_6*nB_2O_3:Eu^{2+}$ where 0<n; $2SrO*0.84P_2O_5*0.16B_2O_3:Eu^{2+}$; $Sr_2Si_3O_{8*}2SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $2SrO*0.84P_2O_5*0.16B_2O_3:Eu^{2+}$ $(Ba,Sr,Ca)MgAl_{10}O_{17}:Eu^{2+}$, $Mn^{2+}$; $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2$: $Eu^{2+},Mn^{2+}$; $Na_2Gd_2B_2O_7:Ce^{3+}$, $Tb^{3+}$; $(Ba,Sr)_2(Ca,Mg,Zn)B_2O_6:K,Ce,Tb$; $(Sr,Ca,Ba,Mg,Zn)_2P_2O_7:Eu^{2+},Mn^{2+}$; $(Ca,Sr,Ba,Mg)_{10}(PO_4)_6(F,Cl,Br,OH):Eu^{2+},Mn^{2+}$; $(Gd,Y,Lu,La)_2O_3:Eu^{3+}$, $Bi^{3+}$; $(Gd,Y,Lu,La)_2O_2S:Eu^{3+},Bi^{3+}$; $(Gd,Y,Lu,La)VO_4:Eu^{3+},Bi^{3+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$; $(Ba,Sr,Ca)MgP_2O_7:Eu^{2+}$, $Mn^{2+}$; $(Y,Lu)_2WO_6:Eu^{3+}, Mo^{6+}$; $(Ba,Sr,Ca)_xSi_yN_z:Eu^{2+}$ and blends thereof.

13. A phosphor composition comprising a host lattice containing $Ce^{3+}$ and $Eu^{2+}$ ions, wherein the $Ce^{3+}$ is capable of absorbing a first radiation having a peak emission from about 350 to about 550 nm and further wherein energy from said absorbed radiation is capable of being transferred from $Ce^{3+}$ ions to the $Eu^{2+}$ ions, resulting in emission of a second radiation from said $Eu^{2+}$ ions, wherein said host lattice is selected from the group consistion of nitrides, oxonitrides, nitridosilicates, and sialons.

14. The phosphor composition of claim 13, wherein said host lattice is selected from the group consisting of:

A) $(Ca,Sr)_{p/2}Si_{12-p-q}Al_{p+q}O_qN_{16-q}$, where q=0 to 2.5 and p=1.5 to 3;

B) $MSi_3N_5$, $M_2Si_4N_7$, $M_4Si_6N_{11}$, $M_9Si_{11}N_{23}$, $M_{16}Si_{15}O_6N_{32}$, $MSiAl_2O_3N_2$, $M_{13}Si_{18}Al_{12}O_{18}N_{36}$, $MSi_5Al_2ON_9$, and $M_3Si_5AlON_{10}$, where M comprises a divalent cation selected from $Ca^{2+}$, $Sr^{2+}$, $Ba^{2+}$ or combination thereof, or a trivalent cation selected from Y, Lu, Gd, Sc, Tb, Y, or combinations thereof;

C) $M_xSi_yN_z$ where M is Ca, Ba, and/or Sr, 0<x, y and z=2/3*x+4/3*y; and

D) $(Mg, Ca, Sr, Ba)_pSi_qAl_rO_xN_y$, where $1 \leq p \leq 16$; $0 \leq q < 30$; $0 \leq r \leq 15$, $0 \leq x < 20$ and $0 < y < 40$.

15. The phosphor composition of claim 13, wherein the $Ce^{3+}$ doping level ranges from about 0.01 to about 20 mol % replacement and the $Eu^{2+}$ doping level ranges from about 0.01 to about 30 mol %.

16. A phosphor blend including a first phosphor having a host lattice comprising $Ce^{3+}$ and $Eu^{2+}$ ions, and at least one additional phosphor, wherein said phosphor blend, when excited by radiation emitted by a semiconductor light source radiationally coupled to said phosphor blend, is capable of emitting light suitable for use in general illumination either alone or in combination with said radiation emitted by said semiconductor light source, wherein said host lattice is selected from the group consistion of nitrides, oxonitrides, nitridosilicates, and sialons.

17. The phosphor blend of claim 16, wherein said host lattice is selected from the group consisting of:

A) $(Ca,Sr)_{p/2}Si_{12-p-q}Al_{p+q}O_qN_{16-q}$, where q=0 to 2.5 and p=1.5 to 3;

B) $MSi_3N_5$, $M_2Si_4N_7$, $M_4Si_6N_{11}$, $M_9Si_{11}N_{23}$, $M_{16}Si_{15}O_6N_{32}$, $MSiAl_2O_3N_2$, $M_{13}Si_{18}Al_{12}O_{18}N_{36}$, $MSi_5Al_2ON_9$, and $M_3Si_5AlON_{10}$, where M comprises a divalent cation selected from $Ca^{2+}$, $Sr^{2+}$, $Ba^{2+}$ or combinations thereof, or a trivalent cation selected from Y, Lu, Gd, Sc, Tb, or combinations thereof;

C) $M_xSi_yN_z$ where M is Ca, Ba, and/or Sr, 0<x, y and z=2/3*x+4/3*y; and

D) $(Mg, Ca, Sr, Ba)_pSi_qAl_rO_xN_y$, where $1 \leq p \leq 16$; $0 \leq q < 30$; $0 \leq r \leq 15$, $0 \leq x < 20$ and $0 < y < 40$.

18. The phosphor blend of claim 16, wherein the $Ce^{3+}$ doping level in said first phosphor ranges from about 0.01 to about 20 mol % replacement and the $Eu^{2+}$ doping level ranges from about 0.01 to about 30 mol %.

19. The phosphor blend of claim 16, wherein said one or more additional phosphors are selected from the group consisting of $(Ba,Sr,Ca)_5(PO_4)_3(Cl,F,Br,OH):Eu^{2+},Mn^{2+}$, $Sb^{3+}$; $(Ba,Sr,Ca)MgAl_{10}O_{17}:Eu^{2+}$, $Mn^{2+}$; $(Ba,Sr,Ca)BPO_5:Eu^{2+}$, $Mn^{2+}$; $(Sr,Ca)_{10}(PO_4)_6*nB_2O_3:Eu^{2+}$; where 0<n; $2SrO*0.84P_2O_5*0.16B_2O_3:Eu^{2+}$; $Sr_2Si_3O_{8*}2SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $2SrO-0.84P_2O_5*0.16B_2O_3:Eu^{2+}$ $(Ba,Sr,Ca)MgAl_{10}O_{17}:Eu^{2+}$, $Mn^{2+}$; $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr, Lu)_3(Al,Ga)_5O_{12}:Ce^{3+}$; $(Ca,Sr)_8(Mg,Zn)(SiO_4)_4Cl_2$: $Eu^{2+},Mn^{2+}$; $Na_2Gd_2B_2O_7:Ce^{3+}$, $Tb^{3+}$; $(Ba,Sr)_2(Ca,Mg,Zn)B_2O_6:K,Ce,Tb$; $(Sr,Ca,Ba,Mg,Zn)_2P_2O_7:Eu^{2+},Mn^{2+}$ $(Ca,Sr,Ba,Mg)_{10}(PO_4)_6(F,Cl,Br,OH):Eu^{2+},Mn^{2+}$; $(Gd,Y,Lu,La)_2O_3:Eu^{3+}$, $Bi^{3+}$; $(Gd,Y,Lu,La)_2O_2S:Eu^{3+},Bi^{3+}$; $(Gd,Y,Lu,La)VO_4:Eu^{3+},Bi^{3+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$; $(Ba,Sr,Ca)MgP_2O_7:Eu^{2+}$, $Mn^{2+}$; $(Y,Lu)_2WO_6:Eu^{3+}, Mo^{6+}$; $(Ba,Sr,Ca)_xSi_yN_z:Eu^{2+}$ and blends thereof.

20. The lighting apparatus of claim 1, wherein said phosphor comprises at least one of $[Ba_{1-a-b-c-d-e-f-g}Sr_aCa_bEu_cCe_dLi_eNa_fK_g]_2Si_5N_8$ where $0 \leq a < 1$, $0 \leq b < 1$, $0 < c \leq 0.2$, $0 < d \leq 0.1$, $0 \leq e \leq 0.1$, $0 \leq f \leq 0.1$, $0 \leq g \leq 0.1$, and d=e+f+g; $[Ba_{1-e-f-g-h-i-j-l}Sr_eCa_fEu_gCe_hLi_iNa_jK_l]Si_7N_{10}$ where $0 \leq e \leq 1$, $0 \leq f \leq 0.3$, $0 < g \leq 0.1$, $0 < h \leq 0.1$, $0 \leq i \leq 0.1$, $0 \leq j \leq 0.1$, $0 \leq l \leq 0.1$, and h=i+j+l; or $[Ca_{1-x-y-z}Sr_xEu_yCe_zLi_z]_{p/2}Si_{12-p-q}Al_{p+q}O_qN_{16-q}$ where $0 < x \leq 0.3$, $0 < y \leq 0.2$, $0 < z \leq 0.1$, $1.5 \leq p \leq 3$, $0 \leq q \leq 2.5$.

21. The phosphor composition of claim 13, wherein said phosphor comprises [at least one of $[Ba_{1-a-b-c-d-e-f-g}Sr_aCa_bEu_cCe_dLi_eNa_fK_g]_2Si_5N_8$ where $0 \leq a < 1$, $0 \leq b < 1$, $0 < c \leq 0.2$, $0 < d \leq 0.1$, $0 \leq e \leq 0.1$, $0 \leq f \leq 0.1$, $0 \leq g \leq 0.1$, and d=e+f+g; $[Ba_{1-e-f-g-h-i-j-l}Sr_eCa_fEu_gCe_hLi_iNa_jK_l]Si_7N_{10}$ where $0 \leq e \leq 1$, $0 \leq f \leq 0.3$, $0 < g \leq 0.1$, $0 < h \leq 0.1$, $0 \leq i \leq 0.1$, $0 \leq j \leq 0.1$, $0 \leq l \leq 0.1$, and h=i+j+l; or $[Ca_{1-x-y-z}Sr_xEu_yCe_zLi_z]_{p/2}Si_{12-p-q}Al_{p+q}O_qN_{16-q}$ where $0 < x \leq 0.3$, $0 < y \leq 0.2$, $0 < z \leq 0.1$, $1.5 \leq p \leq 3$, $0 \leq q \leq 2.5$.

22. The phosphor blend of claim 16, wherein said first phosphor comprises $[Ba_{1-a-b-c-d-e-f-g}Sr_aCa_bEu_cCe_dLi_eNa_fK_g]_2Si_5N_8$ where $0 \leq a < 1$, $0 \leq b < 1$, $0 < c \leq 0.2$, $0 < d \leq 0.1$, $0 \leq e \leq 0.1$, $0 \leq f \leq 0.1$, $0 \leq g \leq 0.1$, and d=e+f+g; $[Ba_{1-e-f-g-h-i-j-l}Sr_eCa_fEu_gCe_hLi_iNa_jK_l]Si_7N_{10}$ where $0 \leq e \leq 1$, $0 \leq f \leq 0.3$, $0 < g \leq 0.1$, $0 < h \leq 0.1$, $0 \leq i \leq 0.1$, $0 \leq j \leq 0.1$, $0 \leq l \leq 0.1$, and $h = i+j+l$; or $[Ca_{1-x-y-z}Sr_xEu_yCe_zLi_z]_{p/2}Si_{12-p-q}Al_{p+q}O_qN_{16-q}$ where $0 < x \leq 0.3$, $0 < y \leq 0.2$, $0 < z \leq 0.1$, $1.5 \leq p \leq 3$, $0 \leq q \leq 2.5$.

* * * * *